United States Patent [19]

Koenig

[11] Patent Number: 5,049,089
[45] Date of Patent: Sep. 17, 1991

[54] LOW COST ARCH CONNECTOR

[75] Inventor: Norbert Koenig, Rochester, N.Y.

[73] Assignee: Eastman Kodak Company, Rochester, N.Y.

[21] Appl. No.: 568,920

[22] Filed: Aug. 17, 1990

[51] Int. Cl.⁵ .............................................. H01R 9/09
[52] U.S. Cl. .................................... 439/493; 439/507
[58] Field of Search .................. 439/67, 77, 492, 493, 439/495, 496, 507, 511; 174/72 B; 29/884, 885

[56] References Cited

U.S. PATENT DOCUMENTS

| | | | |
|---|---|---|---|
| 3,317,652 | 5/1967 | Johannessen et al. | 174/68.5 |
| 3,601,755 | 8/1971 | Shiells | 439/492 |
| 3,805,213 | 4/1974 | Austin | 174/117 |
| 3,919,767 | 11/1975 | Maaz | 29/838 |
| 3,997,229 | 12/1976 | Narozny et al. | 439/492 |
| 4,044,397 | 8/1977 | Moore | 361/398 |
| 4,085,502 | 4/1978 | Ostman et al. | 439/493 |
| 4,109,298 | 8/1978 | Hanni et al. | 361/412 |
| 4,495,546 | 1/1985 | Nakamura et al. | 361/398 |
| 4,684,183 | 8/1987 | Kinoshita et al. | 439/77 |
| 4,781,601 | 11/1988 | Kuhl et al. | 439/77 |

OTHER PUBLICATIONS

Publication: Jerry Lyman; Flexible Circuits Bend to Designer's Will; Electronics; Sep. 1977; pp. 97 to 105.

Primary Examiner—Neil Abrams
Attorney, Agent, or Firm—Michael J. Balconi-Lamica

[57] ABSTRACT

A flexible printed wiring arch connector, having first and second sets of finger-like projections integrally formed on opposite sides of an elongated substrate, is adapted to be inserted and flexibly secured into corresponding apertures of a receiving printed circuit board. A plurality of electrical conductors are formed on the substrate along the elongated dimension thereof. Connector leads, formed on the finger-like projections, are electrically connected to desired individual ones of the conductors and extend in a direction generally perpendicular to the conductors. Arcuate bending of the projections and connector leads in a direction crosswise of the elongated substrate disposes the projections and connector leads for insertion and retention under a restoring spring force in the circuit board apertures. Once flexibly secured in place, the flexible printed wiring arch connector is ready for soldering.

25 Claims, 4 Drawing Sheets

LOW COST ARCH CONNECTOR

BACKGROUND OF THE INVENTION

1. Field of the Invention

This invention relates to the field of flexible printed wiring connectors and, more specifically, to arch connectors for connecting flexible printed wiring members to printed circuit boards and the like.

2. Description of the Related Art

Printed circuit boards, both rigid and flexible, are widely used throughout the electronics industry. Most electronic consumer products contain circuit boards; for example, cameras having an electronic flash. The circuit boards, either rigid or flexible, often require interconnection between them. Numerous interconnection devices have been employed for connecting two printed circuit boards These interconnection devices utilize connecting components which require numerous parts and special tooling in their manufacture These devices are generally bulky, rigid, and not easily adaptable to various physical design configurations or other special design requirements. Such interconnection devices are costly, also.

For instance, U.S. Pat. No. 4,109,298 discloses a rigid printed wiring board connector for use as part of a rigid printed wiring board. This connector is integrally formed with the rigid printed wiring board The rigid connector has rigid finger-like structures which mate with other rigid finger-like structures or with apertures in a rigid receiving printed wiring board A drawback of this type of connector is that special means are required to secure the connector in the rigid receiving printed wiring board; that is, the rigid receiving printed wiring board must be provided with some kind of grasping means to grasp and hold the connector. Having to provide some kind of grasping means requires small tolerances and increased cost in the use of such a connector. Furthermore, such a connector is not easily adaptable to various design requirements of a particular application, especially one involving flexible printed circuits.

In U.S. Pat. No. 4,459,546, a hybrid integrated circuit component is disclosed, the component being formed on a flexible printed circuit and having a connector for insertion into a slot of a motherboard. This connector is similar to a card edge connector and requires rigid support plates. The requirement of rigid support plates increases the cost of manufacturing and using such a device. Furthermore, the connector as disclosed is not easily adaptable to various design requirements of a particular application for interconnecting two printed circuit boards.

Still another interconnecting means is disclosed in U.S. Pat. No. 3,805,213. The '213 patent discloses a flexible circuit connector similar to a card edge connector. In particular, two sets of connector elements along a single edge of a flexible circuit member are bonded to opposite sides of a rigid member. The disadvantage of such a connector is the requirement of the rigid member and thus increasing the manufacturing cost.

Other interconnecting means taught in the art include those disclosed in U.S. Pat. Nos. 4,085,502 and 3,997,229. The '502 patent discloses a jumper cable comprising a plurality of spaced metallic conductors, each conductor having a flexible area and integrally formed rigid terminal ends. The '229 patent discloses a flexible connecting means having a plurality of parallel metal strips; wherein, the metal strips have curled tubular ends provided with stiffening means to provide contact means thereat. A drawback of the interconnecting means disclosed in the '502 patent and the '229 patent is the requirement of having rigid or stiffened terminal ends. Such a requirement increases the manufacturing cost and decreases the adaptability of such devices to the design requirements of a particular application.

SUMMARY OF THE INVENTION

An object of the present invention is to overcome the above noted disadvantages. In particular, the present invention provides a low cost, compact, flexible printed wiring arch connector for connecting a flexible printed wiring member with a printed circuit board.

Another object of the present invention is to provide an arch connector that is easy to use and easily adaptable to a variety of design requirements.

Still another object of the present invention is to provide a low cost flexible arch connector that requires no additional parts nor special tooling in the manufacture thereof.

Still another object of the present invention is to provide a flexible arch connector with a balanced spring force characteristic sufficient to maintain an arch shape when inserted into apertures of a printed circuit board. The spring force characteristic is balanced so as not to cause unacceptable distortion of the arch.

In a preferred embodiment, a flexible printed wiring arch connector, having first and second sets of finger-like projections integrally formed on opposite elongated sides of an elongated substrate, is adapted to be inserted and flexibly secured into corresponding apertures of a receiving printed circuit board. A plurality of substantially parallel electrical conductors are formed on the substrate along the elongated dimension thereof. Connector leads electrically connected to desired individual ones of the conductors are formed on the projections and extend in a direction substantially perpendicular to the conductors. Arcuate bending of the projections and connector leads in a direction crosswise of the elongated substrate disposes the projections and connector leads for insertion and retention under a restoring spring force in the circuit board apertures.

These and other advantages of the present invention will become apparent upon reading the following detailed description of the preferred embodiments.

DESCRIPTION OF THE PREFERRED EMBODIMENTS

Figure 1:
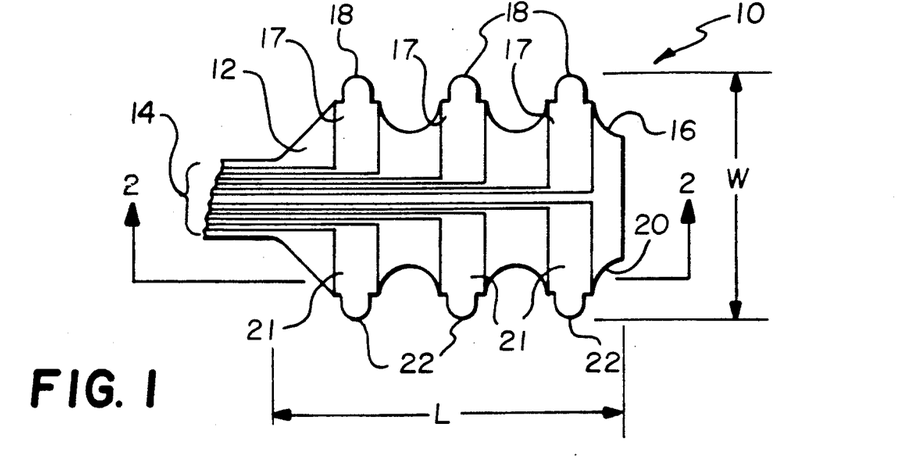
FIG. 1 is a top perspective view of a flexible printed wiring arch connector, according to a preferred embodiment of the invention.

Referring now to FIG. 1, there is shown a flexible printed wiring arch connector 10 according to one embodiment of the invention. In this embodiment, the flexible printed wiring arch connector 10 is an end portion of a flexible printed wiring member (not shown) and is formed integrally therewith. Arch connector 10 comprises an elongated substrate 12 provided with electrical conductors 14 and first and second sets of connector leads 17 and 21, respectively, thereon. Elongated substrate 12 is flexible and insulative. Substrate 12 has a length L and a width W, wherein length L is greater than width W. Conductors 14 extend from the flexible printed wiring member (not shown) and are substantially parallel along length L. Conductors 14 are integral with selected ones of connector leads of first and second sets 17 and 21, respectively. Connector leads of first and second sets 17 and 21, respectively, are substantially perpendicular to corresponding conductors 14. On a first side edge 16 of elongated substrate 12 are formed a first set of finger-like projections 18 having the first set of connector leads 17 thereon. On a second side edge 20, opposite the first side edge 16, of elongated substrate 12 are formed a second set of finger-like projections 22 having the second set of connector leads 21 thereon. In this embodiment, the number of projections is the same on both sides of the connector 10. Substantially equal amounts of conductive material are on opposite sides of a line intermediate the first side edge 16 and the second side edge 20 of arch connector 10. When connector 10 is arched crosswise of the elongated substrate 12, that is, across a line intermediate first side edge 16 and second side edge 20, a balanced spring force characteristic results from the substantially equal distribution of conductive material across the arch.

Figure 2:
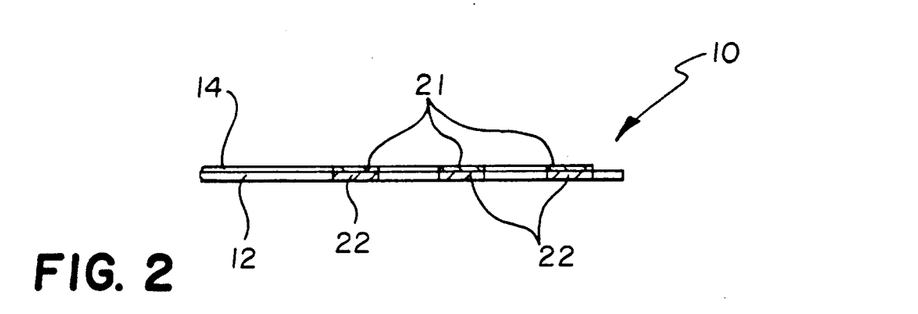
FIG. 2 is a cross-sectional view of the arch connector of FIG. 1 taken along line 2—2.

Turning now to FIG. 2, connector 10 is shown, taken along line 2—2 of FIG. 1, wherein elongated substrate 12 is of substantially uniform thickness. Conductors 14, the first set of connector leads 17, and the second set of conductive leads 21 are substantially uniform in thickness, also.

Figure 3:
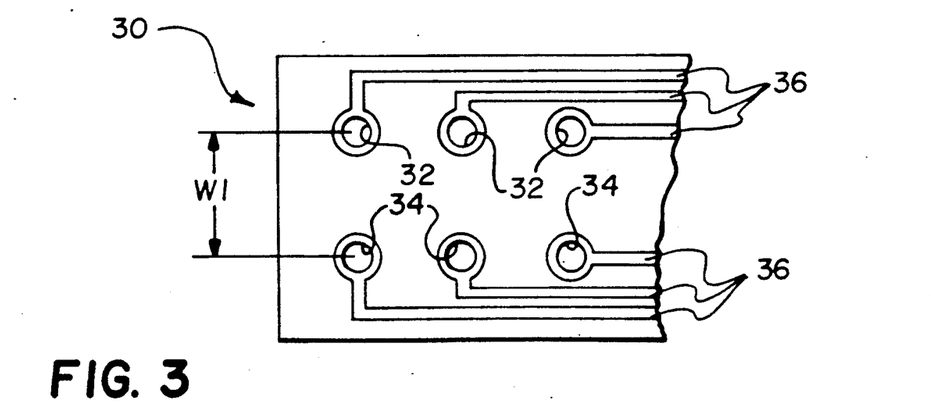
FIG. 3 is a top perspective view of the receiving portion of a printed circuit board having apertures for receiving the arch connector of FIG. 1.

In FIG. 3, a receiving printed circuit board 30 includes a first set of apertures 32 for receiving corresponding first set of finger-like projections 18 of arch connector 10. Printed circuit board 30 further includes a second set of apertures 34 for receiving the corresponding second set of finger-like projections 22. Circuit leads 36 are connected to desired apertures of the first and second sets of apertures 32 and 34, respectively, and to other portions of printed circuit board 30. The first and second sets of apertures, 32 and 34, respectively, are spaced apart from each other by a distance W1, where distance W1 is less than distance W of substrate 12. Receiving printed circuit board 30 can be either a rigid or a flexible circuit board.

Figure 4:
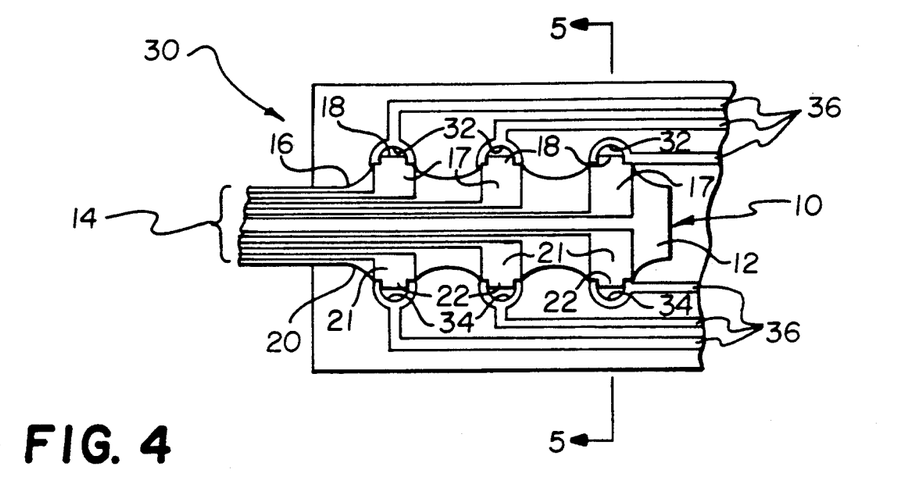
FIG. 4 is a top perspective view of the arch connector of FIG. 1 flexibly secured in the receiving printed circuit board of FIG. 3.
Figure 5:
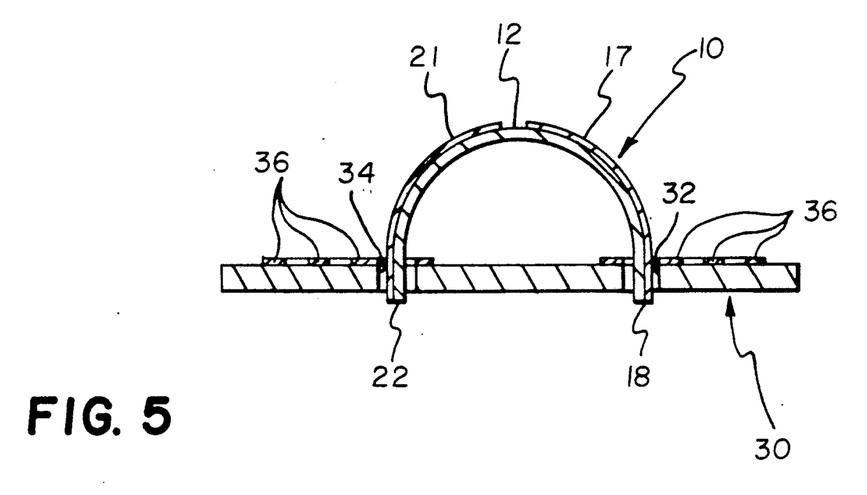
FIG. 5 is cross-sectional view of the arch connector and the printed circuit board of FIG. 4 taken along line 5—5.

FIG. 4 shows connector 10 arched and flexibly secured by the receiving printed circuit board 30. The first set of projections 18 are received by the first set of apertures 32. The second set of projections 22 are received by the second set of apertures 34. A cross-sectional view of arch connector 10 flexibly secured in circuit board 30, taken along line 5—5 is shown in FIG. 5.

Arch connector 10 of the present invention is readily manufactured using the processes for manufacturing flexible printed circuits that are well known in the art. Flexible printed circuits can be made by either the additive or the subtractive process. In the additive process, electroless copper is selectively plated onto a substrate. In the subtractive process, copper is selectively removed by etching a copper-covered substrate. Flexible printed wiring arch connector 10 is formed integrally with a flexible printed wiring member (not shown). Such a flexible printed wiring member can be a flexible printed circuit board or a flexible printed wiring cable. No additional manufacturing process is required since the artwork for arch connector 10 is easily included in the artwork of the printed wiring member. Thus, arch connector 10 of the present invention is produced at low cost. Connector 10 is also easily adaptable to the requirements of a particular application.

Figure 6A:
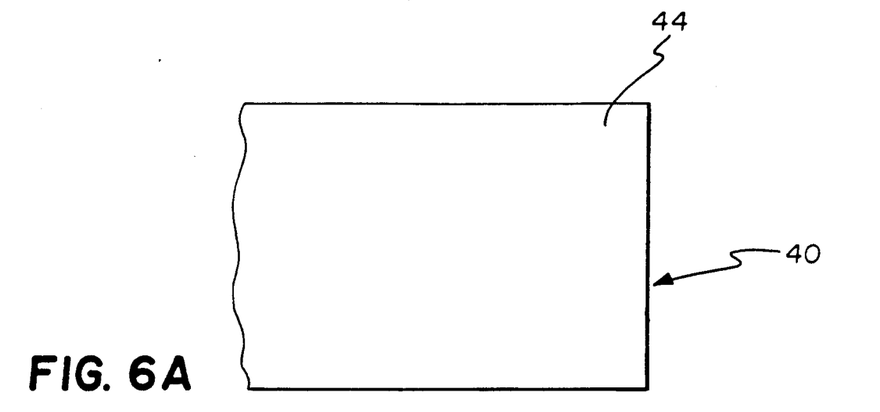
FIGS. 6a–6c depict a flexible printed wiring arch connector at various steps during the manufacturing process.
Figure 6B:
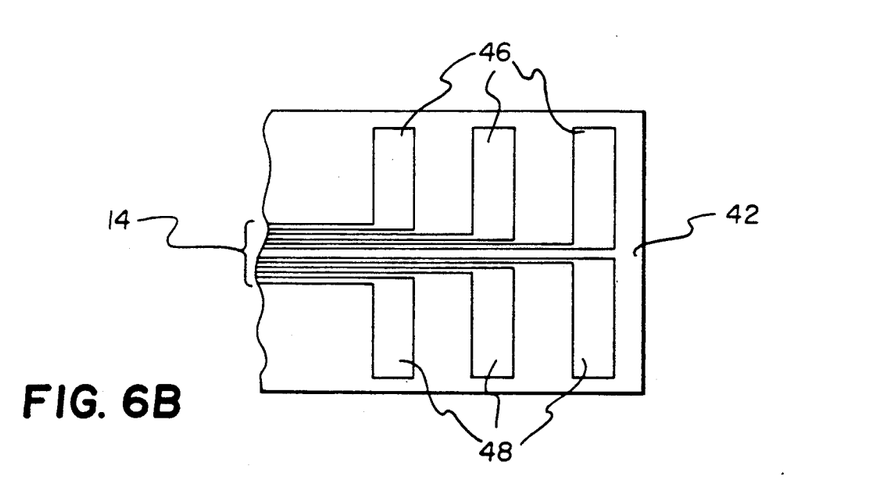
Figure 6C:
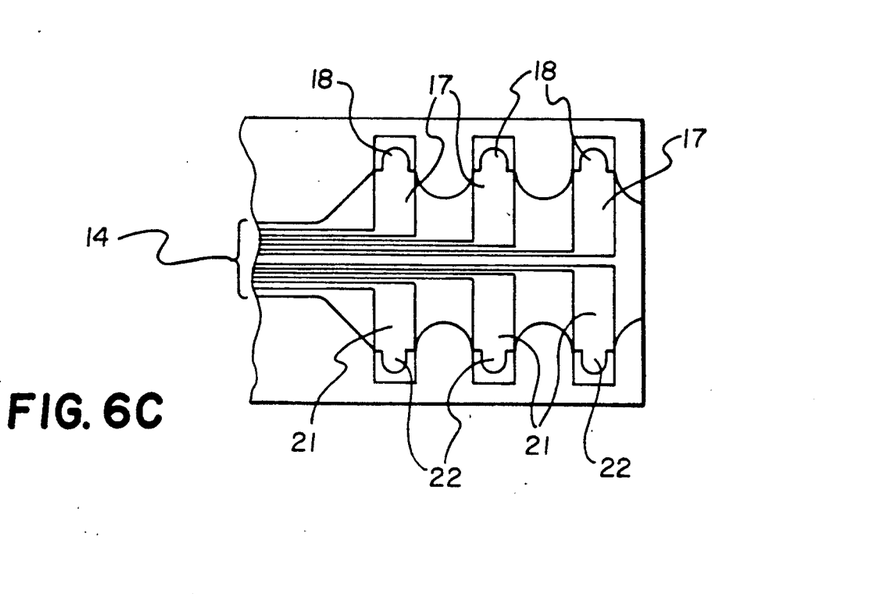

Arch connector 10, as manufactured according to the subtractive process, is shown in FIGS. 6(a)-6(c) at various steps in the manufacturing process. The manufacturing process begins with a conductive-covered flexible substrate 40 having a conductive layer 44 covering flexible insulative substrate 42. Preferably, the conductive layer 44 is copper. An etching resist material is photographically exposed according to the artwork of the printed wiring member which includes the artwork of connector 10. The resist is then developed to produce a conductive pattern such as that of connector 10 shown in FIG. 6(b). The conductive pattern of FIG. 6(b) comprises a first set of conductive pads 46, a second set of conductive pads 48, and conductors 14. Referring now to FIG. 6(c), the substrate 42 with the conductive pattern is then punched or stamped using a desired pattern. As a result, first and second sets of finger-like projections, 18 and 22, respectively, with corresponding first and second sets of connector leads 17 and 21, respectively, are formed to produce the arch connector 10 of the present invention.

Figure 7:
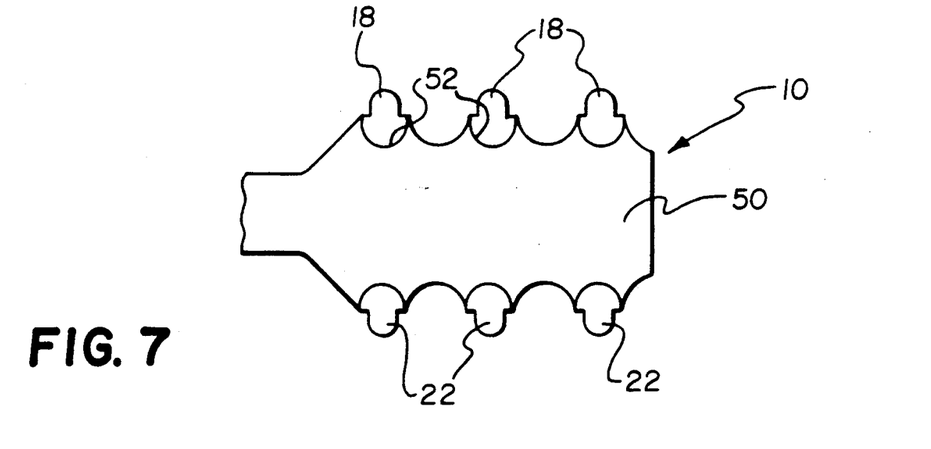
FIG. 7 is a top perspective view of a flexible printed wiring arch connector having a protective cover layer.

The flexible printed circuit arch connector 10 of the present invention may be provided with a protective cover layer 50 as shown in FIG. 7. The protective cover layer 50 provides protection for the conductive pattern of the arch connector 10 when the arch connector 10 is used in an application requiring much flexing. In addition, the cover layer 50 provides protection against accidental short circuits between adjacent circuit leads 14 and first and second plurality of conductive pads 17 and 21 during a soldering process.

The protective cover layer 50 is a clear film layer and is adhered to the substractively etched conductors 14, first set of connector leads 17, second set of connector leads 21, and substrate 42. Cover layer 50 covers the entire connector 10 except at points where the conductors 14, the first set of connector leads 17, and the second set of connector leads 21 are to be tinned. Specifically, a portion of each of the connector leads of the first and second sets 17 and 21, respectively, are not covered by cover layer 50 as shown in FIG. 7.

Cover layer 50 has a curved portion 52 on each projection as shown in FIG. 7 and provides a gradual and varied stress line thereat. The curved portion 52 of cover layer 50 makes each projection less susceptible to fracture and failure when arch connector 10 is flexed, that is, less susceptible to fracture of the connector leads and failure of the arch connector as a component part. Fracture and failure can occur because of abrupt changes in thickness at the edge junctions of the added cover layer 50 and the underlying arch connector 10, particularly at the projections, when the arch connector 10 is flexed across the junction. The curved portion 52 is preferred over a straight junction edge since a straight junction edge would produce an abrupt change in thickness or stress line which would be highly susceptible to fracture and failure when arched.

Figure 8:
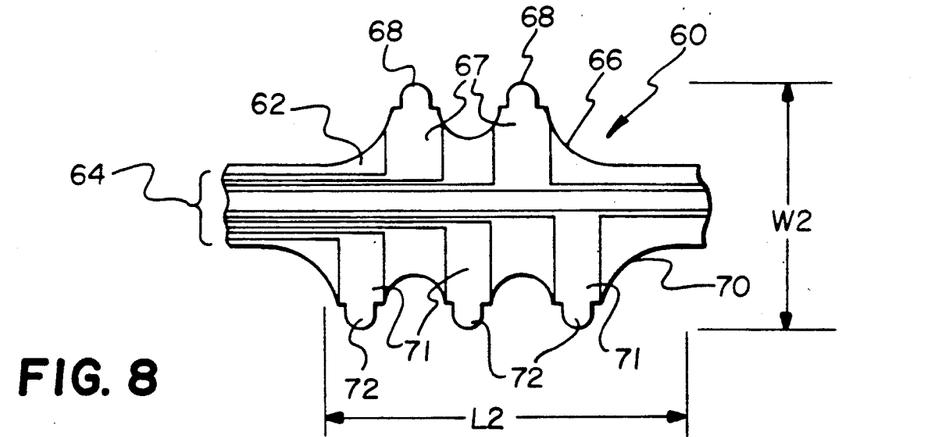
FIG. 8 is a top perspective view of a flexible printed wiring arch connector, according to a second embodiment of the invention.

Referring now to FIG. 8, arch connector 60 is an intermediate portion of a flexible printed wiring member (not shown), according to a second embodiment of the present invention. Arch connector 60 comprises an elongated flexible substrate 62 having conductors 64 thereon and further provided with first and second sets of connector leads 67 and 71, respectively. Substrate 62 has a length L2 and a width W2, wherein length L2 is greater than width W2. Conductors 64 are substantially parallel along length L2 and are integral with selected ones of connector leads of the first and second sets of connector leads, 67 and 71, respectively. The connector leads of the first and second sets of connector leads, 67 and 71, respectively, are substantially perpendicular to corresponding conductors 64. On a first side edge 66 of substrate 62 are formed a first set of finger-like projections 68 having the first set of connector leads 67 thereon. On a second side edge 70 of substrate 62, opposite edge 66, are formed a second set of finger-like projections 72 having the second set of connector leads 71 thereon. The number of projections are different on opposite sides of connector 60 as shown in FIG. 8. An advantage of having different numbers of projections on opposite side edges 66 and 70 of arch connector 60 is the elimination of the need for any type of keying means for insuring that the connector is inserted in the right way into a receiving printed circuit board.

Arch connector 60 of FIG. 8 can be manufactured in the same manner as arch connector 10 as shown in FIGS. 6(a)–6(c) and explained earlier. The artwork pattern of the first set of connector leads 67 is different from the artwork pattern of the second set of connector leads 71. The difference in patterns is to provide substantially equal amounts of conductive material on opposite sides of a line intermediate the first side edge 66 and the second side edge 70 of arch connector 60. Providing substantially equal amounts of conductive material on opposite sides as indicated produces a balanced spring force characteristic in the arch connector 60 when it is flexed in an arched condition. Furthermore, arch connector 60 can be provided with a protective cover layer as also described earlier with respect to the arch connector 10 shown in FIG. 7.

Figure 9:
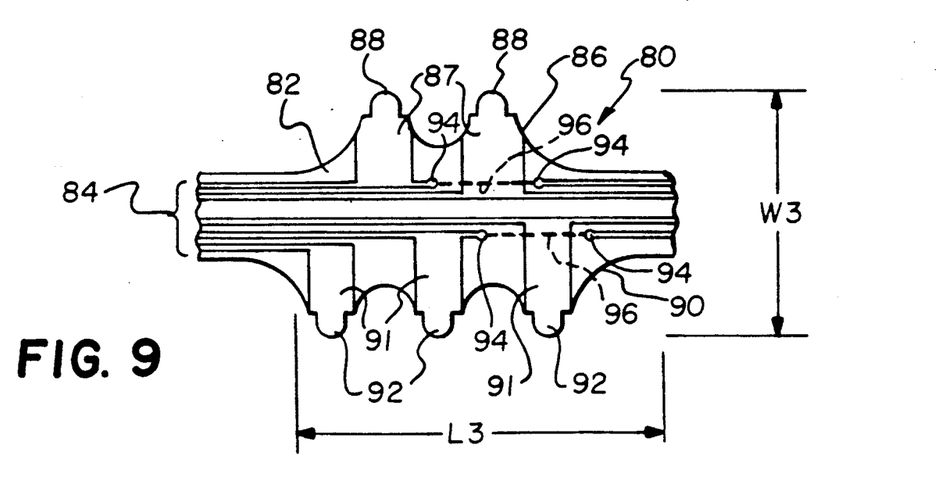
FIG. 9 is a top perspective view of a flexible printed wiring arch connector, according to a third embodiment of the invention.

Arch connector 80 shown in FIG. 9 is a third embodiment of the present invention and represents an intermediate portion of a flexible printed wiring member (not shown). Arch connector 80 comprises an elongated flexible substrate 82 having conductors 84 thereon and further provided with first and second sets of connector leads 87 and 91, respectively. Substrate 82 has a length L3 and a width W3, wherein length L3 is greater than width W3. Conductors 84 are substantially parallel along length L3 and are integral with selected ones of connector leads of the first and second sets of connector leads 87 and 91, respectively. The connector leads of the first and second sets of connector leads 87 and 91, respectively, are substantially perpendicular to corresponding conductors 84. On a first side edge 86 of substrate 82 are formed a first set of finger-like projections 88 having the first set of connector leads 87 thereon. On a second side edge 90 of substrate 82, opposite the first side edge 86, are formed a second set of finger-like projections 92 having a second set of connector leads 91 thereon. The number of projections is different on opposite sides of connector 80 as shown in FIG. 9. The amount of conductive material on opposite sides of a line intermediate the first side edge 86 and the second side edge 90 of arch connector 80 is substantially equal to produce a balanced spring force characteristic in arch connector 80 when it is flexed in an arched condition. In addition, arch connector 80 is provided with solder-through (or plate-through) holes 94 and conductors 96 on the underside thereof for providing a multi-layer flexible printed wiring arch connector. Such solder-through holes are well known in the art and therefore not discussed herein.

Arch connector 80 of FIG. 9 can be manufactured in a similar manner as arch connector 10, explained earlier, wherein the arch connector 80 is manufactured by a process for making a multi-layer flexible printed circuit board. The process for making a multi-layer flexible printed circuit board is well known in the art and therefore is not explained herein. Furthermore, connector 80 can be provided with a protective cover layer similar to cover layer 50 shown in FIG. 7.

In operation, arch connector 10 of FIG. 1 is used in the following manner. While both a manual and an automatic means may be employed for using arch connector 10 of the present invention, only a manual means will be explained since one skilled in the art can easily implement an automatic means for doing the same. Arch connector 10 is grasped on the first side edge 16 and on the second side edge 20 and then flexed along a line intermediate both side edges to form an arch, wherein the conductors 14 are on top of the arch. In other words, connector 10 is flexed in a direction crosswise of the elongated substrate 12. Holding the arch connector 10 in the flexed arched condition, the first and second sets of finger-like projections 18 and 22, respectively, are then inserted into corresponding first and second sets of apertures 32 and 34, respectively, of the receiving printed circuit board 30. Once the first and second sets of projections 18 and 22, respectively, have been inserted into corresponding first and second sets of apertures 32 and 34, respectively, then arch connector 10 is released. That is, edge 16 and edge 20 are released and allowed to flex in an opposite direction to flexibly secure arch connector 10 in place. See FIGS. 4 and 5.

The spring characteristic of the flexible printed wiring arch connector 10 according to the present invention is associated with the flexible substrate 12, the conductive pattern layer, and the optional cover layer 50. A particular application may require a balanced arch spring force characteristic or some other arch spring force characteristic. The configuration of the flexible substrate 12, the conductive pattern layer, and the optional cover layer 50 in the arch connector 10 can be manufactured so as to provide the desired spring characteristic of the particular application. For example, the associated spring characteristic of the flexible substrate 12 is substantially uniform throughout the arch connector along the arch, and therefore the spring characteristic of the conductive pattern layer and the optional cover layer 50 can be configured to meet the particular application's requirements. Decreasing the amount of the conductive pattern layer or cover layer 50 at a particular area or side edge decreases the spring force characteristic with that particular area and vice versa. If a particular application requires that the first and second sets of finger-like projections 17 and 21, respectively, each have different numbers of finger-like projections (as shown in FIG. 8), then the conductive pattern layer and the optional cover layer 50 are configured to normalize the overall spring force balance of arch connector 10 when arched. In other words, conductive pattern layer and cover layer 50 are configured to supply sufficient spring force to maintain the arch connector in an arch shape while engaged in its corresponding receiving printed circuit board, so as not to cause unacceptable distortion of the arch. The above arch spring force characteristic also applies to design applications for multi-layer flexible printed wiring arch connectors (see FIG. 9).

The positioning of each finger-like projection on each side-edge of the arch connector can be positioned to meet the connection location requirements of a particular application. For example, when the number of finger-like projections in the first and second sets of finger-like projections is equal, a keyless arch connector can be produced by making the spacing between at least one pair of finger-like projections, along one side edge, different from the spacing between other finger-like projections. Such a keyless arch connector can be inserted only one way into its corresponding receiving printed circuit board. Thus, improper insertion is prevented.

Once the flexible printed circuit arch connector 10 is flexibly secured in place, connector 10 is ready to be soldered. Soldering is simplified since connector 10 is held in place by itself. Soldering can be accomplished either by manually soldering each finger-like projection to its corresponding aperture or by reflow soldering or by other ways known in the art. For reflow soldering, a soldering paste is placed onto the areas of conductive material to be soldered together and then subjected to infrared heating which produces the soldered connections.

The operation of flexible printed circuit arch connectors 60 and 80 of FIGS. 8 and 9, respectively, are used in the same way as that described above for the flexible printed circuit arch connector 10.

While the invention has been particularly shown and described with respect to the certain preferred embodiments thereof, it will be understood by those skilled in the art that the foregoing and other changes in form and details may be made therein without departing from the spirit and scope of the invention.

What is claimed is:

1. A flexible printed wiring arch connector integrally formed with a flexible printed wiring member and adapted to be inserted into apertures of a printed circuit board, comprising:
    an elongated, flexible, insulative, planar substrate having a plurality of electrical conductors formed thereon extending from the printed wiring member in a direction parallel along the elongated dimension of the substrate;
    first and second sets of finger-like projections integrally formed with the substrate on opposite elongated sides of the substrate; and
    connector leads formed on the projections, electrically connected to desired individual ones of the conductors and extending in a direction generally perpendicular to the conductors, whereby arcuate bending of the projections and connector leads in a direction crosswise of the elongated substrate disposes the projections and connector leads for insertion and retention under a restoring spring force in the circuit board apertures.

2. A flexible printed wiring arch connector as recited in claim 1, wherein the first and second sets of finger-like projections comprise the same number of finger-like projections.

3. A flexible printed wiring arch connector as recited in claim 2, wherein the arch connector constitutes an end portion of the flexible printed wiring member.

4. A flexible printed wiring arch connector as recited in claim 2, wherein the arch connector constitutes an intermediate portion of the flexible printed wiring member.

5. A flexible printed wiring arch connector as recited in claim 1, wherein the first and second sets of finger-like projections comprise different numbers of finger-like projections.

6. A flexible printed wiring arch connector as recited in claim 5, wherein the arch connector constitutes an end portion of the flexible printed wiring member.

7. A flexible printed wiring arch connector as recited in claim 5, wherein the arch connector constitutes an intermediate portion of the flexible printed wiring member.

8. A flexible printed wiring arch connector adapted to be inserted into apertures of a printed circuit board, comprising;
    an elongated, flexible, insulative, planar substrate having a plurality of electrical conductors formed thereon extending parallel along an elongated dimension of the substrate;
    first and second sets of finger-like projections integrally formed with the substrate on opposite elongated sides of the substrate;
    connector leads formed on the projections, electrically connected to desired individual ones of the conductors and extending in a direction generally perpendicular to the conductors, whereby arcuate bending of the projections and connector leads in a direction crosswise of the elongated substrate disposed the projections and connector leads for insertion and retention under a restoring spring force in the circuit board apertures; and
    a protective cover layer covering the elongated substrate, conductors, and portions of each finger-like projection and connector lead, wherein the cover layer forms a curved portion at the edge of the cover layer on each finger-like projection to provide a gradual and varied stress line.

9. A flexible printed wiring arch connector as recited in claim 8, wherein the first said second sets of finger-like projections comprise the same number of finger-like projections.

10. A flexible printed wiring arch connector as recited in claim 9, wherein the arch connector constitutes an end portion of a flexible printed wiring member.

11. A flexible printed wiring arch connector as recited in claim 9, wherein the arch connector constitutes an intermediate portion of a flexible printed wiring member.

12. A flexible printed wiring arch connector as recited in claim 8, wherein the first and second sets of finger-like projections comprise different numbers of finger-like projections.

13. A flexible printed wiring arch connector as recited in claim 12, wherein the arch connector constitutes an end portion of a flexible printed wiring member.

14. A flexible printed wiring arch connector as recited in claim 12, wherein the arch connector constitutes an intermediate portion of a flexible 15. A flexible printed wiring arch connector formed integrally with a flexible printed wiring member and adapted to be inserted into apertures of a printed circuit board, comprising:
   an elongated, flexible, insulative, planar substrate;
   first and second sets of finger-like projections integrally formed with the substrate on opposite elongated sides of the substrate, each said finger-like projections extending outwardly in a direction substantially perpendicular to its corresponding elongated side of the substrate; and
   a layer of conductive material affixed to selected areas of the elongated substrate, the selected areas extending from the printed wiring member and being substantially parallel along the elongated dimension of the substrate, the layer of conductive material further affixed to selected areas of the first and second sets of finger-like projections, each area being joined with the desired ones of the selected areas of the elongated substrate, wherein the desired ones of the selected areas of said first and second sets of finger-like projections are joined substantially perpendicularly to desired ones of the selected areas of the elongated substrate, whereby arcuate bending of said projections in a direction crosswise of the elongated substrate disposes said projections for insertion and retention under a restoring spring force in said circuit board apertures.

16. A flexible printed wiring arch connector as recited in claim 15, wherein the layer of conductive material is substantially equally proportioned between the first and second sets of finger-like projections to provide a balanced spring force characteristic between opposite elongated sides of the substrate.

17. A flexible printed wiring arch connector as recited in claim 16, wherein the connector constitutes an end portion of the printed wiring member.

18. A flexible printed circuit arch connector as recited in claim 16, wherein the connector constitutes an intermediate portion of the printed wiring member.

19. A flexible printed wiring arch connector adapted to be inserted into apertures of a printed circuit board, comprising:
   an elongated, flexible, insulative, planar substrate;
   first and second sets of finger-like projections integrally formed with the substrate on opposite elongated sides of the substrate, each said finger-like projections extending outwardly in a direction substantially perpendicular to its corresponding elongated side of the substrate;
   a layer of conductive material affixed to selected areas of the elongated substrate, the selected areas being substantially parallel along the elongated dimension of the substrate, the layer of conductive material further affixed to selected areas of the first and second sets of finger-like projections, each area being joined with the desired ones of the selected areas of the elongated substrate, wherein the desired ones of the selected areas of said first and second sets of finger-like projections are joined substantially perpendicularly to desired ones of the selected areas of the elongated substrate, whereby arcuate bending of said projections in a direction crosswise of the elongated substrate disposes said projections for insertion and retention under a restoring spring force in said circuit board apertures; and
   a cover layer affixed on top of the substrate, the first and second sets of finger-like projections, and the layer of conductive material except at points where the layer of conductive material is to be tinned, the cover layer having a curved portion on each finger-like projections to provide a gradual and varied stress line.

20. A flexible printed wiring arch connector adapted to be inserted into apertures of a printed circuit board, comprising:
   an elongated, flexible, insulative, planar substrate;
   first and second sets of finger-like projections integrally formed with the substrate on opposite elongated sides of the substrate, each said finger-like projections extending outwardly in a direction substantially perpendicular to its corresponding elongated side of the substrate; and
   a layer of conductive material affixed to selected areas of the elongated substrate, the selected areas being substantially parallel along the elongated dimension of the substrate, the layer of conductive material further affixed to selected areas of the first and second sets of finger-like projections, each area being joined with the desired ones of the selected areas of the elongated substrate, wherein the desired ones of the selected areas of said first and second sets of finger-like projections are joined substantially perpendicularly to desired ones of the selected areas of the elongated substrate, whereby arcuate bending of said projections in a direction crosswise of the elongated substrate disposed said projections for insertion and retention under a restoring spring force in said circuit board apertures, wherein the layer of conductive material affixed to selected areas of the substrate includes selected areas of the top side and the bottom side of the substrate, the substrate being further provided with desired solder-through holes for connection of the layer of conductive material affixed to selected areas of the top side and the bottom side of the substrate.

21. A flexible printed wiring arch connector as recited in claim 20, wherein the layer of conductive material is substantially equally proportioned between the first and second sets of finger-like projections to provide a balanced spring force characteristic between opposite elongated sides of the substrate.

22. A flexible printed wiring arch connector as recited in claim 21, wherein the connector constitutes an end portion of a printed wiring member.

23. A flexible printed circuit arch connector as recited in claim 21, wherein the connector constitutes an intermediate portion of a printed wiring member.

24. A flexible printed wiring arch connector as recited in claim 20, further comprising a cover layer affixed on top of the substrate, first and second sets of finger-like projections, and the layer of conductive material except at points where the layer of conductive material is to be tinned, the cover layer having a curved portion on each finger-like projection to provide a gradual and varied stress line.

25. A flexible printed wiring arch connector as recited in claim 24, further comprising a cover layer affixed on the bottom side of the substrate, first and second sets of finger-like projections, and the layer of conductive material on the bottom side.

* * * * *